(12) United States Patent
Lesso

(10) Patent No.: US 11,431,345 B2
(45) Date of Patent: Aug. 30, 2022

(54) DATA CONVERSION

(71) Applicant: Cirrus Logic International Semiconductor Ltd., Edinburgh (GB)

(72) Inventor: John P. Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/097,741

(22) Filed: Nov. 13, 2020

(65) Prior Publication Data

US 2021/0167787 A1 Jun. 3, 2021

Related U.S. Application Data

(60) Provisional application No. 62/943,007, filed on Dec. 3, 2019.

(51) Int. Cl.
*H03M 1/06* (2006.01)

(52) U.S. Cl.
CPC ................. *H03M 1/0602* (2013.01)

(58) Field of Classification Search
CPC ..... H03M 1/0602; H03M 1/0682; H03M 1/60
See application file for complete search history.

(56) References Cited

U.S. PATENT DOCUMENTS

| | | | |
|---|---|---|---|
| 11,005,482 B1* | 5/2021 | Stuenkel | H03L 7/099 |
| 2015/0145569 A1* | 5/2015 | Perrott | H03M 3/368 |
| | | | 327/157 |
| 2019/0212703 A1* | 7/2019 | Yao | H03L 7/091 |
| 2019/0214976 A1* | 7/2019 | Wu | H03K 5/1565 |

* cited by examiner

*Primary Examiner* — Lam T Mai
(74) *Attorney, Agent, or Firm* — Jackson Walker L.L.P.

(57) ABSTRACT

This application describes method and apparatus for data conversion. An analogue-to-digital converter circuit receives an analogue input signal ($S_{IN}$) and outputs a digital output signal ($S_{OUT}$). The circuit has a sampling capacitor, a controlled oscillator and a counter for generating a count value based on a number of oscillations in an output of the controlled oscillator in a count period during a read-out phase. The digital output signal is based on the count value. The converter circuit is operable in a sampling phase and the read-out phase. In the sampling phase, the sampling capacitor is coupled to an input node for the input signal, e.g. via switch. In the read-out phase, the sampling capacitor is coupled to the controlled oscillator, e.g. via switch, such that capacitor powers the first controlled oscillator and a frequency of oscillation in the output of the first controlled oscillator depends on the voltage of the first capacitor.

16 Claims, 5 Drawing Sheets

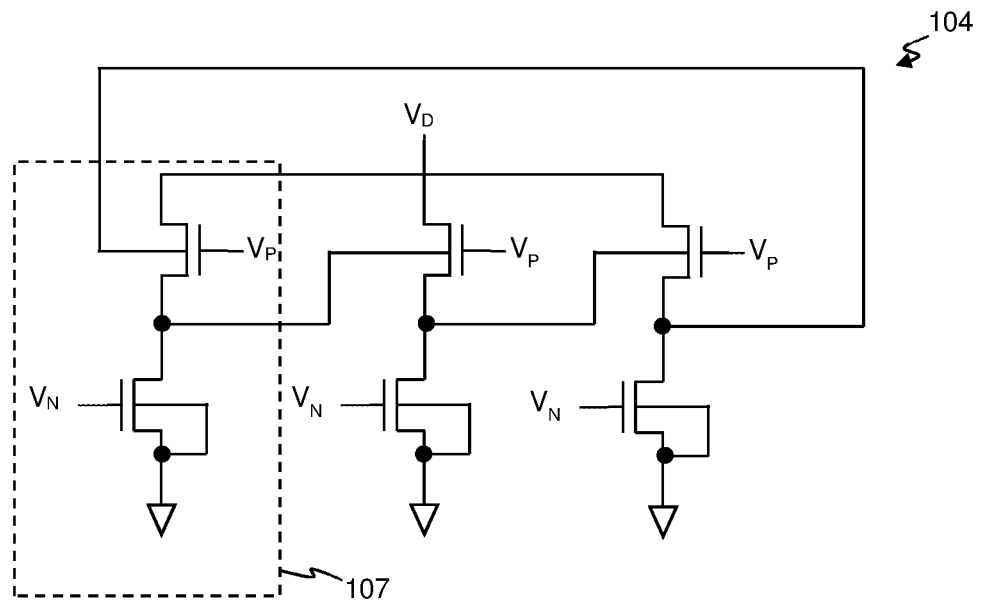
Figure 9
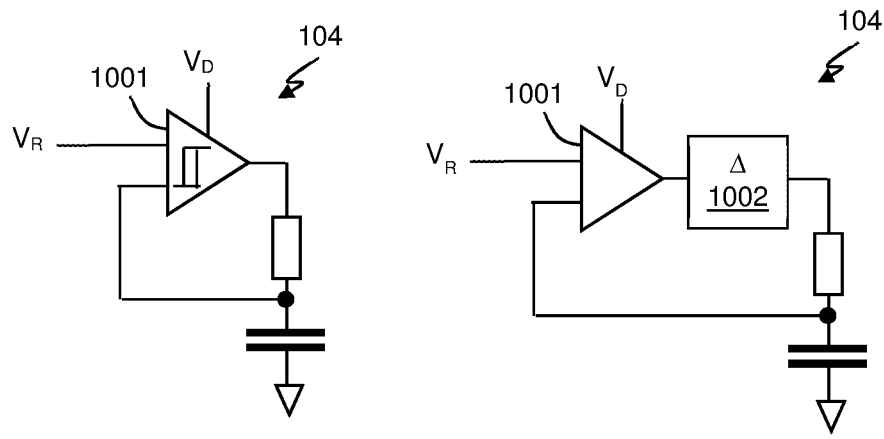
Figure 10aFigure 10b

DATA CONVERSION

FIELD OF DISCLOSURE

The field of representative embodiments of this disclosure relates to methods, apparatus and/or implementations concerning or relating to data conversion circuitry, and, in particular, to analogue-to-digital converters.

BACKGROUND

Conventionally, analogue-to-digital converters (ADCs) are implemented using multiple analogue components such as banks of well-matched or ratioed resistors, capacitors or current sources. However, there is an ongoing trend to smaller semiconductor process node geometries and such circuitry does not scale efficiently in terms of semiconductor area and/or power requirements.

In general, there is also a desire for low-power operation, especially where data conversion, e.g. from analogue to digital, is performed by a battery powered device, and in particular, where the data conversion may be performed in a relatively continuously manner, such as may be required as part of some 'always-on' functionality.

SUMMARY

Embodiments of the present disclosure relate to methods, apparatus and systems for data conversion, for instance to analogue-to-digital converter circuitry, that may be compatible with smaller semiconductor process node geometries and/or may offer relative low power consumption.

According to an aspect of the disclosure there is provided an analogue-to-digital converter circuit for receiving an analogue input signal and outputting a digital output signal. The analogue-to-digital converter circuit comprises a first capacitor, a first controlled oscillator; and a first counter configured to generate a count value based on a number of oscillations in an output of the first controlled oscillator in a count period during a read-out phase, wherein the digital output signal is based on the count value. The analogue-to-digital converter circuit is operable in a sampling phase and the read-out phase. In the sampling phase, the first capacitor is coupled to an input node for the input signal, and, in the read-out phase, the first capacitor is coupled to the first controlled oscillator such that first capacitor powers the first controlled oscillator and a frequency of oscillation in the output of the first controlled oscillator depends on the voltage of the first capacitor.

In some examples the circuit may include a second capacitor, a second controlled oscillator and a second counter configured to generate a count value based on a number of oscillations in an output of the second controlled oscillator during the count period.

In some examples, the circuit may have first and second input nodes for receiving respective first and second input signal components of a differential input signal. The circuit may be configured such that, during the sampling phase, the first capacitor is coupled to the first input node and the second capacitor is coupled to the second input node.

In some examples the circuit may have an input node for receiving the input signal and may be configured such that during the sampling phase, first terminals of the first and second capacitors are both coupled to the input node whilst second terminals of the first and second capacitors are both coupled to a defined voltage, and during the read-out phase, the first terminal of the first capacitor is coupled to the first controlled oscillator whilst the second terminal of the first capacitor is coupled to the defined voltage, and the second terminal of the second capacitor is coupled to the second controlled oscillator whilst the first terminal of the second capacitor is coupled to the defined voltage.

In any of these examples a combiner may be configured to receive a first count value from the first counter and a second count value from the second counter and generate a difference value corresponding to the difference between the first and second count values, wherein the digital output signal is based on the difference value.

In some examples the circuit may comprise a second capacitor and may be configured such that during the sampling phase, first terminals of the first and second capacitors are both coupled to the input node whilst second terminals of the first and second capacitors are both coupled to a defined voltage. The read-out phase may be a first read-out phase, in which the first terminal of the first capacitor is coupled to the first controlled oscillator whilst the second terminal of the first capacitor is coupled to the defined voltage. The converter circuit may further be operable in a second read-out phase in which the second terminal of the second capacitor is coupled to the first controlled oscillator whilst the first terminal of the second capacitor is coupled to the defined voltage. In such an example, a combiner may be configured to receive a first count value from the first counter during the first read-out phase and a second count value from the first counter during the second read-out phase and generate a difference value corresponding to the difference between the first and second count values, wherein the digital output signal is based on the difference value.

In any of the examples discussed herein, a compensation module configured to apply a defined compensation function to the output value to compensate for conversion non-linearity.

In some examples the controlled oscillator may comprise a ring-oscillator. The ring-oscillator may comprise a plurality of inverters connected such that the output of each inverter is connected to drive a bulk terminal of a transistor of another inverter and the ring-oscillator may comprise zero-threshold voltage or native transistor devices.

In some examples the controlled oscillator may comprise a relaxation oscillator.

The circuit may include a level-shifter in a signal path between the output of the first controlled oscillator and the input to the first counter.

The converter circuit may be implemented as an integrated circuit. The converter circuit may, in some applications, be implemented as part of an analogue computing circuit.

Aspects also relate to electronic device comprising the converter circuit according to any of the variants discussed herein.

In another aspect there is provided a data conversion circuit comprising a sampling capacitor and a controlled oscillator. The circuit may be configured to selectively charge the sampling capacitor with an input signal during a sampling phase and to discharge the sampling capacitor into the controlled oscillator so as to power the controlled oscillator in a read-out phase.

In another aspect there is provided an analogue-to-digital circuit comprising: a capacitor, a controlled oscillator; and a switch for selectively connecting a terminal of the capacitor to a drive input of the controlled oscillator.

In another aspect there is provided a data conversion circuit comprising a sampling capacitor and an analogueto-digital converter; the circuit being configured to selectively charge the sampling capacitor with an input signal during a sampling phase and to discharge the sampling capacitor into the analogue-to-digital converter so as to power the analogue-to-digital converter in a read-out phase.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 9 illustrates an example of a suitable ring oscillator; and

FIGS. 10a and 10b illustrate examples of alternative controlled oscillators.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As noted above, there is a desire for a data conversion circuitry, such analogue-to-digital converter (ADC) circuitry that can be relatively small in terms of circuit area and/or to have a relatively low power consumption in use. Additionally or alternatively it may be desirable for data conversion circuitry to be suitable for being implemented efficiently with relatively small semiconductor process node geometries.

Figure 1:
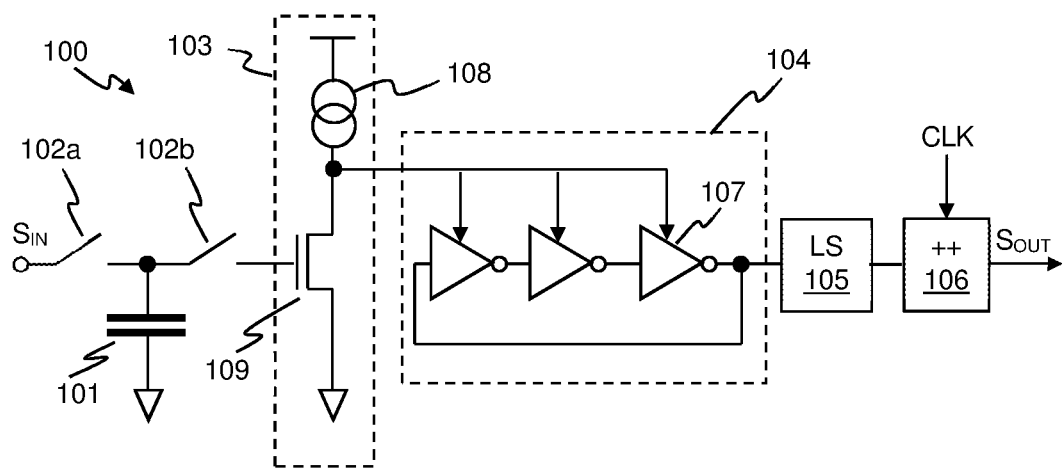
FIG. 1 illustrates an example of a data conversion circuit.

It has been proposed to use a controlled oscillator and a counter as part of a data conversion circuit, as such circuitry scales reasonably well to smaller process node geometries. FIG. 1 illustrates one example of a data conversion circuit 100 using a controlled oscillator.

FIG. 1 illustrates that the data conversion circuit 100 receives an input signal $S_{IN}$, which may be an analogue current for example. In this example, the input signal $S_{IN}$ is used to charge a sampling capacitor 101 during a sampling phase, with switch 102a closed and switch 102b open, such that, at the end of the sampling phase, the voltage on the sampling capacitor 101 represents a sampled value of the input signal $S_{IN}$. During a read-out phase, switch 102a is open, and switch 102b closed, so that the voltage held on the sampling capacitor 101 is supplied to buffer 103 for driving the controlled oscillator 104, which in this example is a voltage-controlled oscillator (VCO) 104.

The VCO 104 thus, during the read-out phase, generates an oscillation signal with a frequency that depends on the strength of the drive signal supplied from buffer 103, which in turn depends on the sampled voltage held by the sampling capacitor 101. The VCO 104, in this example, is a ring-oscillator comprising a ring of series connected inverters. As will be understood by one skilled in the art, the series connection of the inverters 107 propagates signal transitions around the ring, where each inverter 107 has a propagation delay that depends on the drive strength of an oscillator drive signal. In this example the buffer 103 comprises a current source 108 which is connected in series with a transistor 109, with an input to the VCO 104 being tapped from between the current source 108 and transistor 109. In the read-out phase, the gate of the transistor 109 is coupled to the sampling capacitor 101 so that the effective resistance of the transistor 109 depends on the voltage held on the sampling capacitor 101. Hence the voltage at the drive input to the VCO 104 depends on the sampled voltage held by sampling capacitor 101.

The oscillation signal output from the VCO 104 is, in this example, supplied to a level-shifter which shifts the oscillation signal to an appropriate level for counter 106. The counter generates a count value based on the frequency or period of the oscillation signal. For instance, the counter may count the number of oscillations in an output of the first controlled oscillator in a count period defined by a clock signal CLK. This count value is thus an indication of the frequency of the oscillation signal, and hence corresponds to the sampled voltage held by the sampling capacitor 101. The count value may be output as a digital output signal $S_{OUT}$.

At the end of the read-out phase, the sampling capacitor 101 may be discharged to a defined starting voltage prior to the next sampling phase.

The data conversion circuit 1 illustrated in FIG. 100 thus operates as an analogue-to-digital converter (ADC) and, as mentioned, can be realised efficiently in terms of circuit area.

Embodiments of the present disclosure relate to data conversion circuitry that may offer advantages in terms of power efficiency. In embodiments of the present disclosure the charge stored in a sampling capacitor during a sampling phase may be used to provide power for other parts of the data conversion circuitry during a read-out phase.

Figure 2:
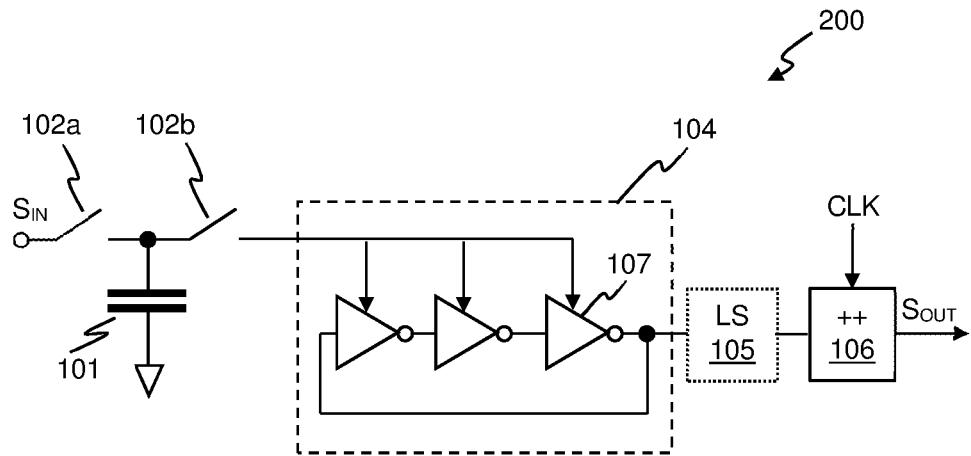
FIG. 2 illustrates an example of a data conversion circuit according to an embodiment.

FIG. 2 illustrates a data conversion circuit 200 according to an embodiment, in this case an ADC circuit, in which similar components to those discussed with reference to FIG. 1 are identified by similar components.

The ADC circuit 200 comprises a sampling capacitor 101 which, in a sampling phase is coupled to an input node for an input signal $S_{IN}$, for instance by closing switch 102a. During the sampling phase switch 102b may be open to isolate the sampling capacitor 101 from the rest of the ADC circuitry. The sampling capacitor 101 is charged during the sampling phase so that the voltage on the sampling capacitor 101 at the end of the sampling phase corresponds to the value of the input signal $S_{IN}$, which may be a current signal or a voltage signal. Note that as the sampling capacitor is charged over the duration of the sampling phase, the input signal could be analogue signal that encodes a value by the average current or voltage over the duration of the sampling phase, for instance a pulse-width modulated current signal.

During a read-out phase, switch 102a may be opened to isolate the sampling capacitor from the input node and switch 102b may be closed to couple the sampling capacitor to the controlled oscillator 104. In this example the controlled oscillator is a VCO 104, for instance comprising a ring arrangement of series connected inverters 107 as discussed with reference to FIG. 1. In the embodiment of FIG. 2, the switch 102b couples a sampling capacitor 101 to the VCO 104 during the read-out phase so that the sampling capacitor 101 powers the VCO 104. In other words, during the read-out phase, a continuous conductive path is established between a terminal of sampling capacitor 101 and a drive input of VCO 104 so that the sampling capacitor 101 discharges to drive the VCO 104. Switch 102b may thus directly coupled a terminal of sampling capacitor 101 to a drive input of VCO 104 during the read-out phase.

The ADC circuit 200 of FIG. 2 thus omits the buffer 103 illustrated in FIG. 1 that would conventionally be regarded as necessary.

As noted, during the read-out phase, the VCO 104 draws charge from the sampling capacitor 101 to operate, i.e. the sampling capacitor 101 thus discharges over the read-out phase. This means that the voltage of the sampling capacitor 101 will vary during the read-out phase, e.g. the voltage will droop. This voltage droop means that the drive strength of the oscillator drive signal will also vary during the read-out phase.

Conventionally such voltage droop would be regarded as problematic, and hence the voltage held by the sampling capacitor 101 would be buffered by a buffer 103 such as discussed with reference to FIG. 1. In embodiments of the present disclosure however the charge stored on the sampling capacitor 101 during the sampling phase, is used to power the VCO 104 during the read-out phase, with the result that the voltage on the sampling capacitor 101 varies.

As the voltage of the sampling capacitor 101, and hence the drive strength for the VCO 104, varies over the course of the read-out phase, the frequency of the oscillation signal output from the VCO 104 also varies. However, it can be shown that the total number of oscillations in a count period is related to the voltage of the sampling capacitor at the start of the read-out phase.

For a ring oscillator comprising a series of inverters 107 as illustrated in FIG. 2, each inverter may, as will be understood by one skilled in the art, comprise a PMOS device and NMOS device in series between a high voltage and a low voltage. The high voltage may, in this example, be the voltage of the sampling capacitor 101 and the low voltage could, for example, be ground. If the input to the inverter is high, the PMOS is off and the NMOS is on, and thus the output is low. When the input to the inverter transitions high, the NMOS turns off and the PMOS turns on. The PMOS then draw current from the supply, in this example from the sampling capacitor 101, to charge the gate capacitance of the next inverter stage. During a transition of the inverter from a high output state to a low input state, the NMOS is turned on the discharge the gate capacitance of the next stage.

Charge is thus drawn from the sampling capacitor 101 during transitions of the inverters of the ring oscillators. Given the relationship Q=CV between charge Q and capacitance C and voltage V, the charge drawn from the sampling capacitor 101 to charge the gate capacitance $C_{GATE}$ will be proportional to the gate capacitance and the drive voltage (at the end of the transition), and during the transition the voltage on the sampling capacitor will drop proportionally to the amount of charge drawn and inversely proportional to the capacitance $C_{SAM}$ of the sampling capacitor. Thus:

$$V_{n+1} = V_n - \frac{C_{GATE} V_{n+1}}{C_{SAM}} \qquad \text{Eqn 1}$$

where $V_n$ is the voltage after the nth relevant transition and $V_{n+1}$ is the voltage after the next relevant transition. Thus:

$$V_{n+1} = V_n \left( \frac{C_{SAM}}{C_{SAM} + C_{GATE}} \right) \qquad \text{Eqn. 2}$$

In general, then, if $V_0$ is the voltage of the sampling capacitor at the start of the read-out phase, the voltage $V_n$ after n transitions will be:

$$V_n = V_0 \cdot \alpha^n \text{ where } \alpha = \frac{C_{SAM}}{C_{SAM} + C_{LOAD}} \qquad \text{Eqn. 3}$$

The propagation delay for the inverters depends on the time taken to charge or discharge the gate capacitance during a transition. When transitioning from low-output to high-output the current drawn by an inverter in strong inversion is:

$$I = k(V_D - V_T)^2 \qquad \text{Eqn. 4}$$

where $V_D$ is the drive voltage, e.g. the voltage of the sampling capacitor 101, $V_T$ is a threshold voltage for the PMOS device and k is a constant that depends on the PMOS device characteristics, as will be understood by one skilled in the art.

Given the relationship that the product of current and time is equal to the product of capacitance and voltage, it can be seen that the propagation delay $t_d$ is equal to:

$$t_d = \frac{C_{Gate} V_D}{k(V_D - V_T)^2} \qquad \text{Eqn. 5}$$

It can thus be seen that the initial propagation delay $t_0$ is thus $$t_0 = \frac{C_{Gate} V_0}{k(V_0 - V_T)^2} \qquad \text{Eqn. 6}$$

Over time, as the drive voltage decreases the propagation delay will increase according to:

$$t_n = t_0 \cdot \alpha^n \qquad \text{Eqn. 7}$$

From equations 3 and 7 it can be seen that the voltage of the sampling capacitor 101 will decrease over time following a hyperbolic curve.

The relationship of equation 7 is also valid for the ring oscillator as whole, i.e. in terms of cycle period, provided that $t_0$ is scaled appropriately by the number of inverter stages and the $C_{GATE}$ term of α represents the total gate capacitance of the ring oscillator. On this basis the time required for the VCO 104 to generate M oscillations is equal to:

$$T = \sum_{n=0}^{M} t_0/\alpha^n = \frac{\alpha^{-M}(\alpha^{1-M} - 1)}{\alpha - 1} t_0 \qquad \text{Eqn. 8}$$

Figure 8:
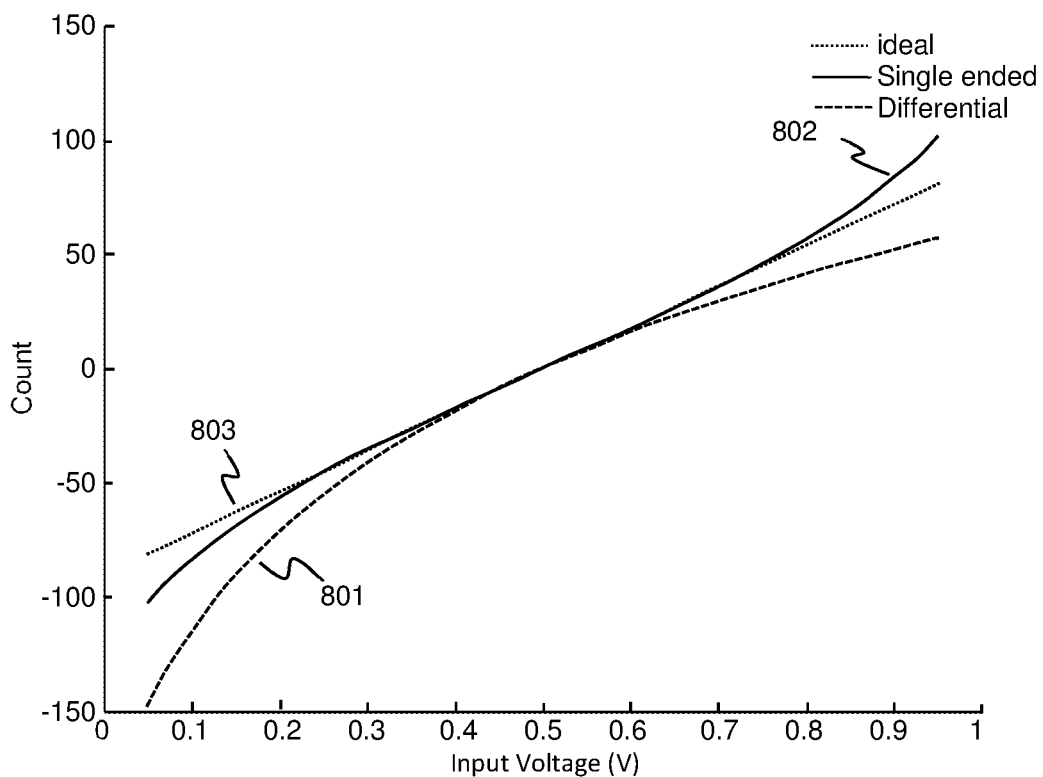
FIG. 8 illustrates plots of count value against sampled voltage for non-differential conversion, differential conversion and ideal conversion.

The relationship of FIG. 8 can be used to determine how long a count period may be needed to achieve a given accuracy, for instance by setting M equal to a number which is two to the power of the required bits of accuracy.

Solving for M determines how many oscillations of the oscillation signal will occur during a given period T, e.g. a count period.

$$M = -\ln\left\{\frac{1 - \frac{(\alpha - 1)kT(V_0 - V_T)^2}{C_{Gate}V_0}}{\alpha}\right\} \qquad \text{Eqn. 9}$$

Assuming that $V_T$ is zero, this can be represented (with a change in logarithm base) as:

$$M = \log_{\alpha}\left\{1 + \frac{kTV_0}{C_{SAM} + C_{GATE}}\right\} \qquad \text{Eqn. 10}$$

If k is less than 1 then the number of oscillations M in a given count period T exhibits a relationship to the initial voltage $V_0$ which is close to linear, thus a count value of the number of oscillations can be used as a reasonably accurate value of the initial voltage $V_0$, i.e. the voltage held on the sampling capacitor at the start of the read-out phase, which corresponds to the sampled value of the input signal $S_{IN}$.

It may therefore be advantageous to implement the ring oscillator with devices such that the factor k is small. Also, beneficially $C_{SAM}$ may be much greater than $C_{GATE}$ to ensure linearity and also to minimize the time required for a count period for a given accuracy. From equation 8 above it will be noted that the time taken to achieve a desired level of accuracy has a strong dependence on the factor α and it may be desirable to keep this factor α, which is equal to $C_{SAM}/(C_{SAM}+C_{GATE})$ to be close to unity, to minimize the time required for a count period for a given accuracy.

During the read-out phase the sampling capacitor 101 thus drives and powers the VCO 104, which generates an oscillation signal output. This oscillation signal may in, some examples, be shifted by level shifter 105, before being input to counter 106, although in some implementations the counter 10 may be able to count the number of oscillations, e.g. the number of defined signal transitions or edges, in the oscillation signal without the need for level shifter 105. The counter 106 may generate a count value of the number of oscillations in a defined time period. The counter 106 may be an asynchronous counter, e.g. a ripple counter.

As noted above the count value of the number of oscillations in the oscillation signal during the count period depends on the voltage of the sampling capacitor 101 at the start of the read-out phase and may exhibit a reasonably good linear relationship therewith.

The count value may thus be output as an output signal $S_{OUT}$ which is thus a digital signal representing the input signal $S_{IN}$.

In some embodiments the counter 106 may output the count value, but in some embodiments the counter may apply some processing to the count value before outputting the output signal $S_{OUT}$. For instance, the counter, or some downstream processing unit, may be configured to apply some scaling or adjustment to the count value to account for conversion gain of the ADC circuit, for instance based on predetermined values in a look-up table or applying some defined scaling function.

The data conversion circuit 200 of FIG. 2 thus provides an ADC circuit that can be implemented in a small circuit area and which provides reduced power consumption compared to the circuitry of FIG. 1. The data conversion circuit 200 omits the need for a voltage buffer with the associated power consumption such as discussed with respect to FIG. 1. Embodiments of the present disclosure make use of the charge stored in the sampling capacitor 101 during the sampling phase for power during the read-out phase. Conventionally, the charge stored in the sampling capacitor 101 would be held during the read-out phase before being effectively dumped in a reset before the next sampling phase, and thus the work done in charging the sampling capacitor 101 would be wasted.

Figure 3:
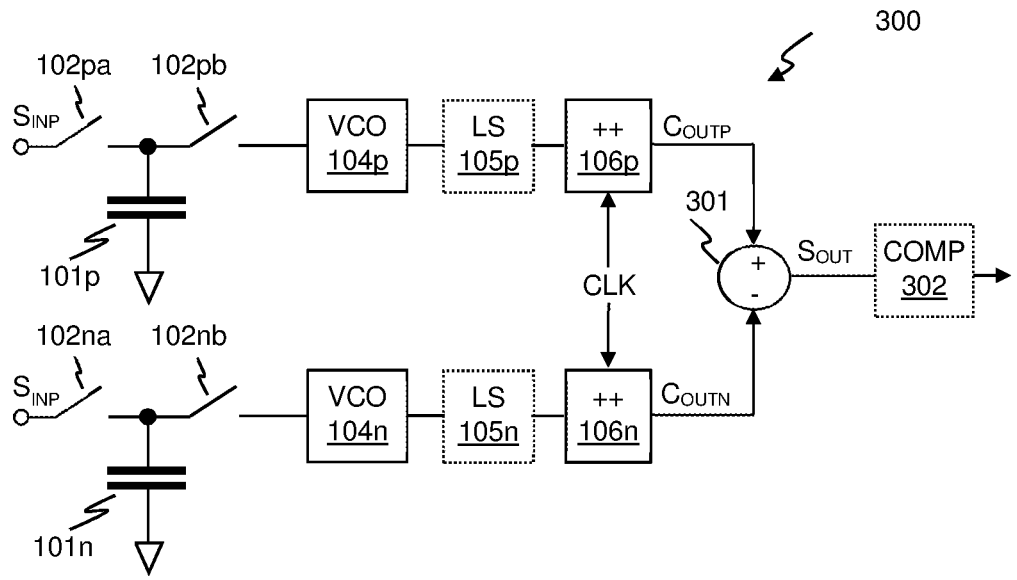
FIG. 3 illustrates an example of a data conversion circuit for converting a differential input signal.

In some embodiments the data conversion circuitry may be configured to perform the data conversion differentially, which may improve the linearity of the conversion. FIG. 3 illustrates an example of a data conversion circuit 300 which operates to convert a differential input signal, having first and second input signal components $S_{INP}$ and $S_{INN}$. FIG. 3 illustrates a first sampling capacitor 101p and a second sampling capacitor 101n configured such that, during the sampling phase, the first sampling capacitor 101p is coupled to a first input node for sampling the first input signal component $S_{INP}$ and the second sampling capacitor 101n is coupled to a second input node for sampling the second input signal component $S_{INP}$. The ADC circuit 300 has respective first and second processing paths for read-out of the first and second sampling capacitors 101p and 101n respectively, each comprising a respective VCO 104p and 104n powered by the relevant sampling capacitor during the read-out phase.

Each processing path also includes a respective counter 106p and 106n and possibly a respective level-shifter 105p/105n. The respective counters 106p and 106n provide first and second count values $C_{OUTP}$ and $C_{OUTN}$. A combiner 301 receive the first and second count values and generate a difference value corresponding to the difference between the first and second count values, which may be output as the output signal $S_{OUT}$.

The differential conversion provided by the data conversion circuit 300 of FIG. 3 can reduce or eliminate the even harmonic distortion of the conversion, which is the dominant effect. In some embodiments additional compensation could be applied by some processing to the output signal to compensate for non-linearity. For example, a compensation module 302 may be configured to apply a defined compensation function to the output value to compensate for conversion non-linearity. The compensation function could, for example, be a polynomial distortion applied to the digital signal, e.g. to compensate for third harmonic distortion.

Figure 4:
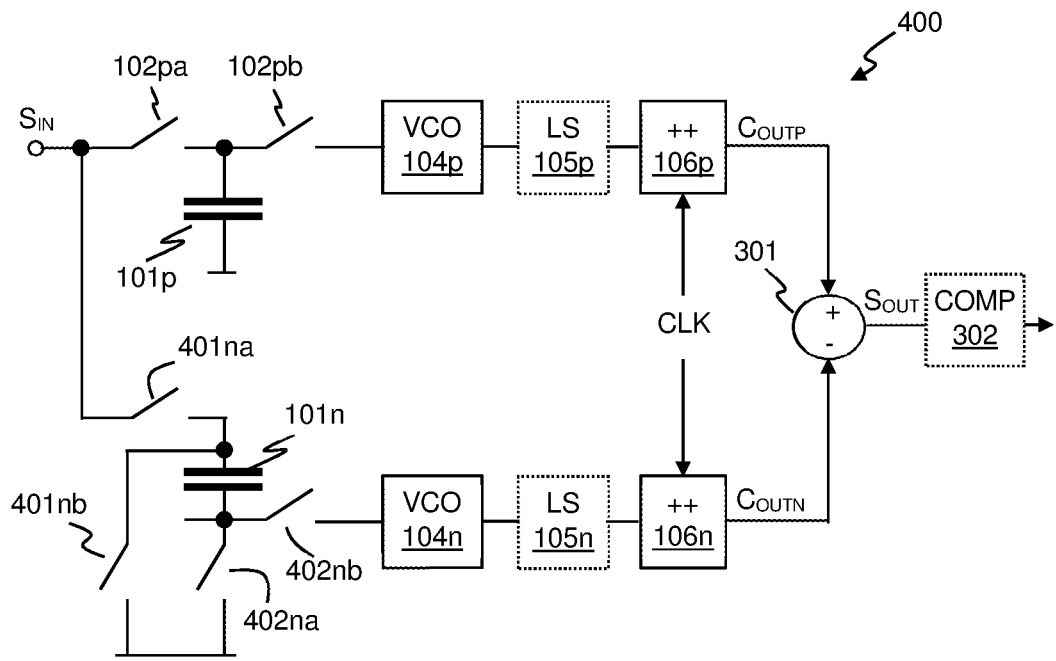
FIG. 4 illustrates an example of a data conversion circuit for differential conversion of a single-ended input signal.

Differential conversion could also be applied to a single ended input signal. FIG. 4 illustrates a data conversion circuit 400, e.g. an ADC circuit, for performing differential conversion of a single ended input signal $S_{IN}$. FIG. 4 illustrates that the circuit 400 has first and second sampling capacitors 101p and 101n. In the sampling phase, first terminals of both sampling capacitors are connected to an input node for the input signal $S_{IN}$ whilst second terminals of both sampling capacitors are coupled to a defined voltage, which may be a defined midpoint voltage $V_{MID}$. In the sampling phase both the first and second sampling capacitors 101p and 101n are thus charged to the same voltage $V_{SAM}$ with respect to the midpoint voltage $V_{MID}$. During the read-out phase, the first terminal of the first sampling capacitor 101p may be coupled to the VCO 104p of the first processing path, whilst the second terminal of the first sampling capacitor 101p remains coupled to the defined voltage $V_{MID}$. This presents a voltage of $V_{MID}+V_{SAM}$ to the first VCO. During the same read-out phase, the second terminal of the second sampling capacitor 101n is coupled to the VCO 104n of the second processing path, whilst the first terminal of the first sampling capacitor 101p is coupled to the defined voltage $V_{MID}$. This presents a voltage of $V_{MID}-V_{SAM}$ to the second VCO 104n.

Switches 102pa and 102pb may thus be provided to selectively couple the first terminal of the first sampling capacitor 101p to the input node or the VCO 104p as described previously, whilst the second terminal remains coupled to the defined voltage.

For the second sampling capacitor, switches 401na and 402na may be closed in the sampling phase to couple the first terminal to the input node and the second terminal to ground. These switches may be opened in the read-out phase, and switches 401nb and 402nb closed to couple the first terminal to the defined voltage and second terminal to VCO 104n.

Figure 5:
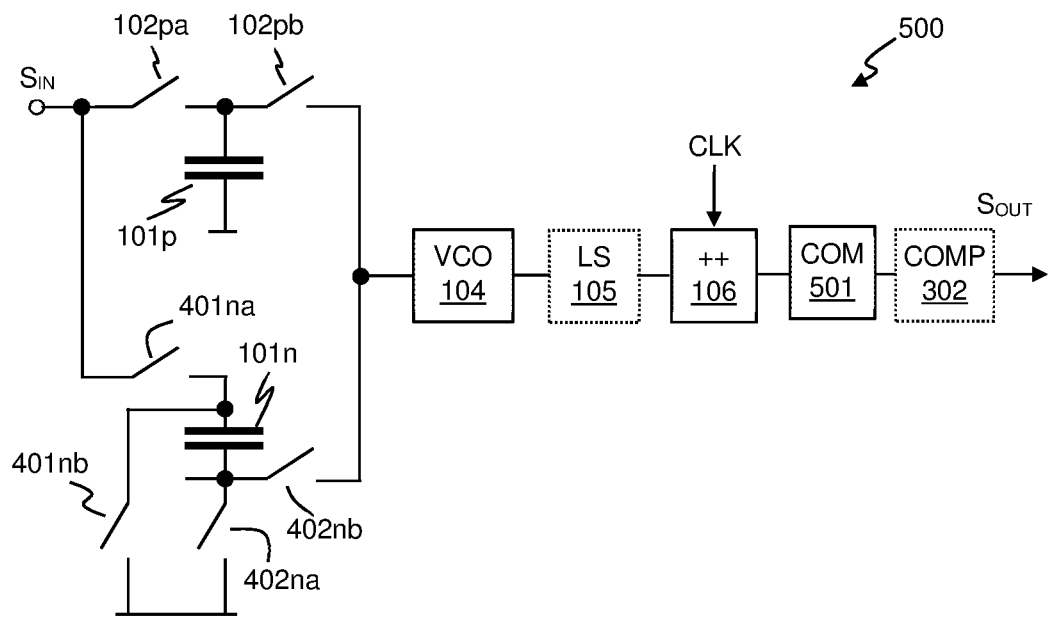
FIG. 5 illustrates another example of a data conversion circuit for differential conversion of a single-ended input signal.

Whilst FIG. 4 illustrates a conversion circuit with first and second processing paths for read-out of the first and second sampling capacitors 101p and 101n simultaneously, in some embodiment the voltages on the first and second sampling capacitors could be read-out separately by the same read-out circuitry in sequential read-out phases. For instance, FIG. 5 illustrates a data conversion circuit with two sampling capacitors for sequential read-out. During a common sampling phase, the first and second sampling capacitors may both be connected in parallel between the input node for the input signal $S_{IN}$ and the defined voltage e.g. the midpoint voltage. In the sampling phase, switches 102pa, 401na and 402na may be closed, with switches 102pb, 402na and 402nb open. During a first read-out phase, the first terminal of the first sampling capacitor may be coupled to the VCO 104, by closing switch 102pb, with the other switches open. This presents the voltage $V_{MID}+V_{SAM}$. During a second read-out phase, switches 402na and 402nb may be closed, with all other switches opened to present the voltage $V_{MID}-V_{SAM}$ to the VCO 104. It will of course be appreciated that the read-out phases could occur in a different order.

In this case, a combiner 501 may be provided to receive and hold a count value from the counter 106 from the first read-out phase and then receive a count value from the counter 106 from the second read-out phase and determine a difference value. In some embodiments the counter 106 could be implemented as an up-down counter and configured to increment during one of the read-out phase and decrement during the other of the read-out phase so as to provide the difference value.

Figure 6:
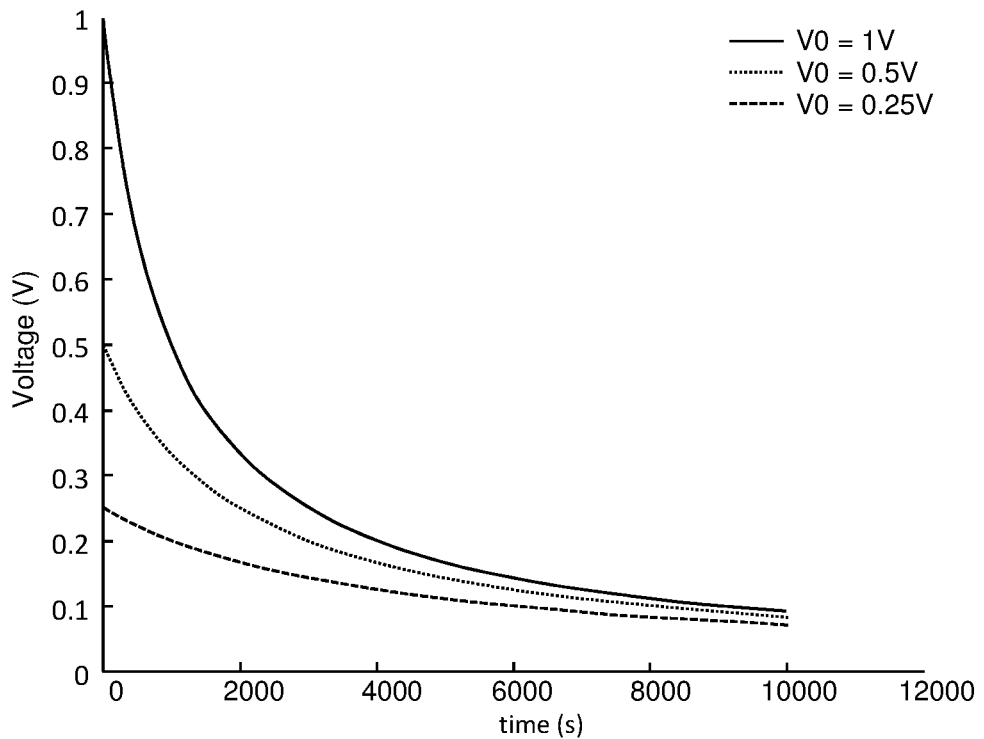
FIG. 6 illustrates a plot of voltage against time for the voltage of the sampling capacitor.

FIGS. 6 to 8 illustrate the results of simulations for data conversion circuits according to embodiments of the invention. These simulations modelled a capacitance for the sampling capacitor of 1 farad and modelled the VCO as ring-oscillator where the inverters comprise zero $V_t$ devices so as to model transistors in strong inversion. FIG. 6 illustrates how the voltage of the sampling capacitor drops over time when powering the VCO and shows curves illustrating three different starting voltages, in this case 1V, 0.5V and 0.25V. This simulation shows that the voltage of the sampling capacitor does droop over time in a hyperbolic fashion.

Figure 7A:
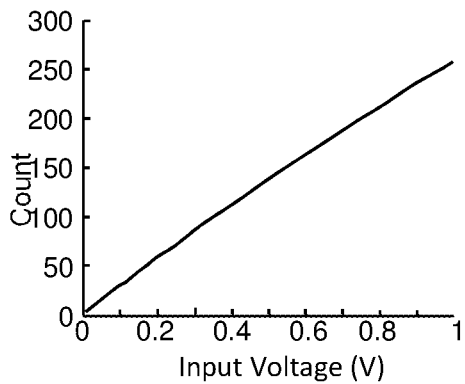
FIGS. 7a and 7b illustrate examples of plots of count value against sampled voltage for a fixed count period.
Figure 7B:
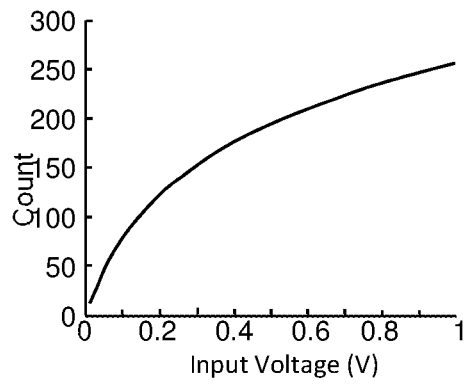

FIGS. 7a and 7b illustrate the number of oscillations of the output of the VCO in a defined count period against the starting voltage of the sampling capacitor at the start of a read-out phase, i.e. the sampled voltage from the input signal. FIG. 7a illustrates the result for simulation where the ratio of capacitance of the sampling capacitor $C_{SAM}$ to the total gate capacitance of the ring oscillator $C_{GATE}$ was high, in this case $C_{SAM}/C_{GATE}$ was modelled as 1000. FIG. 7b illustrates the result with a lower ratio of $C_{SAM}/C_{GATE}$ equal to 50. In both cases the count value in a fixed count period increases with sampled voltage, but it can be seen the higher ratio of $C_{SAM}/C_{GATE}$ of FIG. 7a provides a much more linear response than the lower ratio of FIG. 7b. FIG. 8 illustrates a similar plot of count value against sampled voltage (but with the axes swapped) but illustrates a plot 801 of the response using a non-differential converter circuit such as illustrated in FIG. 2, compared to a plot 802 of the response using a differential converter circuit such as illustrated in FIG. 3 and also a plot 803 of the ideal response. It can be seen that the differential conversion can improve linearity compared to non-differential conversion.

As discussed above the VCO 104 may be a ring-oscillator such as provided by a series of inverters, as illustrated generally in FIG. 2. The oscillator may be built using zero-$V_T$ (zero-threshold voltage) or native devices, so as to ensure the device operate in strong inversion. In some embodiments the devices of the inverters may be configured to be bulk-driven, e.g. by a drive applied to the bulk of the transistors.

FIG. 9 illustrates one example of a ring oscillator that may be used in embodiments of the present disclosure. FIG. 9 illustrates a plurality of series connected inverters 107, each inverter comprising a PMOS and an NMOS in series between the drive voltage $V_D$, i.e. the voltage of the sampling capacitor, and voltage reference such as ground. The gates of the devices are held at defined voltages and the inverters are driven by driving the bulk of the PMOS devices.

Whilst ring-oscillators may be usefully used for the controlled oscillators of embodiments of the present disclosure, in some embodiments other types of controlled oscillator may be used instead, for instance controlled oscillators based on relaxation oscillators or self-oscillating modulators. FIGS. 10a and 10b illustrate two examples of self-oscillating, relaxation type controlled oscillators that may be suitable for use. FIG. 10a illustrates a self-oscillating modulator that comprises a comparator 1001, which in this case is a hysteretic comparator, that compares a reference voltage VR with a feedback signal which is the output signal filtered, in this case by a passive filter comprising a resistor and capacitor. The drive voltage $V_D$ for the comparator may be drawn from the sampling capacitor 101 and can power the comparator. The oscillation frequency depends on and varies with the drive strength. Such a controlled oscillator may also be implemented as a small and low power component that can be powered by the voltage of the sampling capacitor. FIG. 10b shows a similar controlled oscillator in which a delay element 1002 is included within the feedback loop. The inclusion of a delay element 1002 means that comparator 1001 need not be a hysteretic comparator, although in some embodiments a delay element may be included along with hysteresis within the comparator 1001 to provide desired frequency characteristics.

Embodiments thus relate to data conversion circuits comprising a sampling capacitor; and a controlled oscillator the circuit being configured to selectively charge the sampling capacitor with an input signal during a sampling phase and to discharge the sampling capacitor into the controlled oscillator so as to power the controlled oscillator in a read-out phase. The principles of the disclosure may however apply to the use of a sampling capacitor, which is charged in a sampling phase, to power other types of read-out circuitry, i.e. another type of ADC which need not include a controlled oscillator. In general, therefore, embodiments relate to data conversion circuits comprising a sampling capacitor and an analogue-to-digital converter, the circuit being configured to selectively charge the sampling capacitor with an input signal during a sampling phase and to discharge the sampling capacitor into the analogue-to-digital converter so as to power the analogue-to-digital converter in a read-out phase.

As mentioned above embodiments of the disclosure can be implemented as low power data conversion circuits. Such data conversion circuits may be usefully employed in a variety of applications.

For example, one application that may benefit from small and/or low power data conversion circuitry may be analogue computing, in particular, for neuromorphic computing. For instance, neuromorphic computing may use at least some analogue or mixed-signal circuitry that can implement a model of a neural system, e.g. an artificial neural networks (ANN).

ANNs are increasingly being proposed for use in a number of different areas, e.g. for classification or recognition purposes. An ANN typically comprises a large number of processing nodes or artificial neurons which can receive a plurality of data inputs and generate an output based on a weighted combination of the data inputs and a transfer function. An ANN may be trained using a training data set to establish a set of overall weights to perform a particular task. Once trained, the ANN can be used for inference with newly acquired input data.

Processing data using a trained ANN, i.e. performing inference, may involve significant computation. Implementing a trained ANN for inference using a conventional digital processor, e.g. based on the known Von Neumann architecture, may involve a very large number of calculations, with associated memory reads and data writes, and this may have disadvantages in terms of power and processing latency.

It has therefore been proposed that at least part of the processing for an ANN may be performed using analogue computing, where at least some of the processing occurs in the analogue domain and data values are represented by instantaneous or average currents and/or voltages. Processing nodes of the ANN may thus include some analogue computing circuitry that generates an analogue output signal representing the result of the calculation. The analogue voltage or current may then be converted into another format, e.g. digital, for further processing. Such an analogue computing arrangement may thus require a large number of data conversion circuits for the large number of processing nodes. It is therefore desirable that the data conversion circuits be relatively small in area and/or have relatively low power consumption.

It will be understood however that many other applications may also benefit from low power data conversion circuitry.

Embodiments may be implemented as an integrated circuit which in some examples could be an analogue computing circuit or inference engine or similar, or an audio codec or the like. Embodiments may be implemented in a host device, especially a portable and/or battery powered host device such as a mobile computing device for example a laptop, notebook or tablet computer, a communication device, such as a mobile or cellular telephone or smartphone, a games console or gaming device, a remote control device, a home automation controller or a domestic appliance including a domestic temperature or lighting control system, a toy, a machine such as a robot, an audio player, a video player, or a mobile telephone for example a smartphone. The device could be a wearable device such as a smartwatch. The device may be a voice-controlled device and/or a device with some speech recognition and/or speaker recognition functionality. It will be understood that embodiments may be implemented as part of a system provided in a home appliance or in a vehicle or interactive display.

The skilled person will recognise that some aspects of the above-described apparatus and methods, for example the combination of counts values and application of compensation, may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An analogue-to-digital converter circuit for receiving an analogue input signal and outputting a digital output signal comprising:
 a first capacitor;
 a first controlled oscillator; and
 a first counter configured to generate a count value based on a number of oscillations in an output of the first controlled oscillator in a count period during a read-out phase,
  wherein the digital output signal is based on the count value;
  wherein the analogue-to-digital converter circuit is operable in a sampling phase and said read-out phase, wherein:
   in the sampling phase the first capacitor is coupled to an input node for the input signal; and
   in the read-out phase the first capacitor is coupled to the first controlled oscillator such that first capacitor powers the first controlled oscillator and a frequency of oscillation in the output of the first controlled oscillator depends on the voltage of the first capacitor.

2. An analogue-to-digital converter circuit as claimed in claim 1 further comprising a second capacitor, a second controlled oscillator and a second counter configured to generate a count value based on a number of oscillations in an output of the second controlled oscillator during the count period.

3. An analogue-to-digital converter circuit as claimed in claim 2 having first and second input nodes for receiving respective first and second input signal components of a differential input signal and configured such that, during the sampling phase, the first capacitor is coupled to the first input node and the second capacitor is coupled to the second input node.

4. An analogue-to-digital converter circuit as claimed in claim 2 having an input node for receiving the input signal and configured such that:
 during the sampling phase, first terminals of the first and second capacitors are both coupled to the input node whilst second terminals of the first and second capacitors are both coupled to a defined voltage; and
 during the read-out phase, the first terminal of the first capacitor is coupled to the first controlled oscillator whilst the second terminal of the first capacitor is coupled to the defined voltage, and the second terminal of the second capacitor is coupled to the second controlled oscillator whilst the first terminal of the second capacitor is coupled to the defined voltage.

5. An analogue-to-digital converter circuit as claimed in claim 2 further comprising a combiner configured to receive a first count value from the first counter and a second count value from the second counter and generate a difference value corresponding to the difference between the first and second count values, wherein the digital output signal is based on the difference value.

6. An analogue-to-digital converter circuit as claimed in claim 1 comprising a second capacitor and wherein the analogue-to-digital converter circuit is configured such that:
 during the sampling phase, first terminals of the first and second capacitors are both coupled to the input node whilst second terminals of the first and second capacitors are both coupled to a defined voltage;
 said read-out phase is a first read-out phase in which the first terminal of the first capacitor is coupled to the first controlled oscillator whilst the second terminal of the first capacitor is coupled to the defined voltage; and
 the analogue-to-digital converter circuit is further operable in a second read-out phase in which the second terminal of the second capacitor is coupled to the first controlled oscillator whilst the first terminal of the second capacitor is coupled to the defined voltage.

7. An analogue-to-digital converter circuit as claimed in claim 6 further comprising a combiner configured to receive a first count value from the first counter during the first read-out phase and a second count value from the first counter during the second read-out phase and generate a difference value corresponding to the difference between the first and second count values, wherein the digital output signal is based on the difference value.

8. An analogue-to-digital converter circuit as claimed in claim 1 comprising a compensation module configured to apply a defined compensation function to the output value to compensate for conversion non-linearity.

9. An analogue-to-digital converter circuit as claimed in claim 1 wherein the first controlled oscillator comprises a ring-oscillator.

10. An analogue-to-digital converter circuit as claimed in claim 9 wherein the ring-oscillator comprises a plurality of inverters connected such that the output of each inverter is connected to drive a bulk terminal of a transistor of another inverter.

11. An analogue-to-digital converter circuit as claimed in claim 9 where the ring-oscillator comprises zero-threshold voltage or native transistor devices.

12. An analogue-to-digital converter circuit as claimed in claim 1 wherein the first controlled oscillator comprises a relaxation oscillator.

13. An analogue-to-digital converter circuit as claimed in claim 1 comprising a level-shifter in a signal path between the output of the first controlled oscillator and an input to the first counter.

14. An analogue-to-digital converter circuit as claimed in claim 1 implemented as an integrated circuit.

15. An analogue-to-digital converter circuit as claimed in claim 1 wherein the converter circuit is implemented as part of an analogue computing circuit.

16. An electronic device comprising the analogue-to-digital converter circuit as claimed in claim 1.

* * * * *